(12) United States Patent
Katase

(10) Patent No.: US 11,798,855 B2
(45) Date of Patent: Oct. 24, 2023

(54) ELECTRONIC MODULE AND EQUIPMENT

(71) Applicant: CANON KABUSHIKI KAISHA, Tokyo (JP)

(72) Inventor: Yu Katase, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 576 days.

(21) Appl. No.: 16/904,675

(22) Filed: Jun. 18, 2020

(65) Prior Publication Data
US 2020/0402872 A1    Dec. 24, 2020

(30) Foreign Application Priority Data

Jun. 24, 2019   (JP) ................. 2019-116631

(51) Int. Cl.
  *H01L 23/055*   (2006.01)
  *H05K 7/20*   (2006.01)
  (Continued)

(52) U.S. Cl.
  CPC ........ *H01L 23/055* (2013.01); *H01L 23/3675* (2013.01); *H01L 23/49822* (2013.01);
  (Continued)

(58) Field of Classification Search
  CPC ............. H01L 23/055; H01L 23/49822; H01L 2224/73265; H01L 23/5387; H01L 2224/49175; H01L 2924/15184; H01L 2924/16195; H01L 2924/19105; H01L 23/3675; H01L 224/06181; H01L 2224/09181; H01L 2224/48141; H01L 2224/30181; H01L 2224/33181; H01L 23/10; H01L 23/3185; H01L 2924/183; H01L 2924/163–1632; H01L 23/3735;
  (Continued)

(56) References Cited

U.S. PATENT DOCUMENTS 3,290,564 A * 12/1966 Wolff, Jr. .............. H01L 23/488
                                                             257/796
5,841,190 A * 11/1998 Noda ................. H01L 23/49575
                                                          257/E23.172
(Continued)

FOREIGN PATENT DOCUMENTS

JP    2015-084377 A       4/2015
JP    2020017561 A  *    1/2020  ............. H01L 27/01
(Continued)

*Primary Examiner* — Earl N Taylor
(74) *Attorney, Agent, or Firm* — Venable LLP

(57) ABSTRACT

An electronic module comprises a substrate including a first surface and a second surface on a side opposite to the first surface, the second surface including a first region and a second region surrounding the first region, an electronic device attached to the first surface, a component attached to the first region of the second surface, a lid member positioned to face the electronic device, and a frame member attached to the substrate to support the lid member. A first member and a second member having a higher thermal conductivity than the first member are disposed at least on the second surface. At least a part of the second member is positioned to face the second region. At least a part of the first member is positioned between the second member and the component.

23 Claims, 12 Drawing Sheets

(51) Int. Cl.
*H01L 23/498* (2006.01)
*H01L 23/367* (2006.01)
*H01L 23/538* (2006.01)

(52) U.S. Cl.
CPC ........ *H05K 7/2039* (2013.01); *H01L 23/5387* (2013.01); *H01L 2224/49175* (2013.01); *H01L 2224/73265* (2013.01); *H01L 2924/15184* (2013.01); *H01L 2924/16195* (2013.01); *H01L 2924/19105* (2013.01)

(58) Field of Classification Search
CPC ......... H01L 23/4334; H01L 23/49568; H05K 7/2039
See application file for complete search history.

(56) References Cited

U.S. PATENT DOCUMENTS

| | | | | |
|---|---|---|---|---|
| 6,175,149 | B1* | 1/2001 | Akram | H01L 24/32 |
| | | | | 257/676 |
| 6,313,598 | B1* | 11/2001 | Tamba | H01L 25/165 |
| | | | | 361/728 |
| 7,417,327 | B2* | 8/2008 | Webster | H01L 23/49805 |
| | | | | 257/784 |
| 8,895,440 | B2* | 11/2014 | Choi | H01L 23/3114 |
| | | | | 438/667 |
| 9,123,685 | B2* | 9/2015 | Yap | H01L 23/367 |
| 9,190,399 | B2* | 11/2015 | Lamorey | H01L 25/50 |
| 9,576,877 | B2* | 2/2017 | Suzuki | H01L 23/055 |
| 9,585,287 | B2* | 2/2017 | Katase | H05K 7/2039 |
| 9,774,769 | B2* | 9/2017 | Suzuki | H04N 23/54 |
| 9,978,675 | B2* | 5/2018 | Suzuki | H01L 23/49541 |
| 10,068,817 | B2 | 9/2018 | Bovaird | H01L 23/055 |
| 10,735,673 | B2* | 8/2020 | Shimizu | H04N 23/51 |
| 10,831,235 | B2* | 11/2020 | Katase | H01L 27/14618 |
| 10,958,860 | B2* | 3/2021 | Nozu | H01L 27/01 |
| 2005/0116138 | A1* | 6/2005 | Hanada | H01L 27/14625 |
| | | | | 250/206 |
| 2006/0138638 | A1* | 6/2006 | Komatsu | H01L 21/486 |
| | | | | 257/E23.079 |
| 2007/0152313 | A1* | 7/2007 | Periaman | H01L 25/0657 |
| | | | | 257/E25.013 |
| 2013/0083493 | A1* | 4/2013 | Kurihara | B23K 1/0016 |
| | | | | 361/809 |
| 2013/0286565 | A1* | 10/2013 | Tsuduki | H01L 23/10 |
| | | | | 361/679.01 |
| 2013/0286566 | A1* | 10/2013 | Tsuduki | H05K 5/0091 |
| | | | | 361/679.01 |
| 2013/0286592 | A1* | 10/2013 | Tsuduki | H01L 21/50 |
| | | | | 361/707 |
| 2014/0237805 | A1* | 8/2014 | Suzuki | H01L 23/055 |
| | | | | 29/592.1 |
| 2014/0264808 | A1* | 9/2014 | Wolter | H01L 23/3128 |
| | | | | 257/774 |
| 2014/0339668 | A1* | 11/2014 | Arima | H01L 23/4006 |
| | | | | 257/443 |
| 2014/0362535 | A1* | 12/2014 | Meier | H01L 23/4985 |
| | | | | 361/761 |
| 2015/0108661 | A1* | 4/2015 | Vincent | H01L 24/25 |
| | | | | 257/777 |
| 2015/0116946 | A1* | 4/2015 | Katase | H05K 7/2039 |
| | | | | 361/713 |
| 2015/0116975 | A1* | 4/2015 | Suzuki | H01L 23/36 |
| | | | | 29/592.1 |
| 2016/0307954 | A1* | 10/2016 | Arima | H04N 23/54 |
| 2017/0062297 | A1* | 3/2017 | Tran | H01L 21/50 |
| 2017/0062663 | A1* | 3/2017 | Hayashi | H01L 33/486 |
| 2017/0271221 | A1* | 9/2017 | Bovaird | H01L 23/055 |
| 2018/0130719 | A1* | 5/2018 | Fang | H01L 21/52 |
| 2018/0175267 | A1* | 6/2018 | Hirasawa | H01L 33/60 |
| 2018/0190622 | A1* | 7/2018 | Lin | H01L 23/4952 |
| 2019/0058842 | A1* | 2/2019 | Totsuka | H04N 25/702 |
| 2019/0165034 | A1* | 5/2019 | Kaneda | H01L 27/1463 |
| 2019/0294213 | A1* | 9/2019 | Katase | H01L 27/14605 |
| 2019/0335119 | A1* | 10/2019 | Shimizu | H04N 23/54 |
| 2019/0348334 | A1* | 11/2019 | Chaves | H01L 23/28 |
| 2019/0385940 | A1* | 12/2019 | Ishiguri | H01L 27/14618 |
| 2020/0029039 | A1* | 1/2020 | Nozu | H04N 25/76 |
| 2020/0075437 | A1* | 3/2020 | Nozu | H01L 27/14609 |
| 2020/0133054 | A1* | 4/2020 | Oshige | G02F 1/136227 |
| 2020/0374462 | A1* | 11/2020 | Noguchi | H04N 23/51 |
| 2021/0242099 | A1* | 8/2021 | Takeshita | H05K 1/182 |

FOREIGN PATENT DOCUMENTS

| | | | | |
|---|---|---|---|---|
| JP | 2020035925 | A | * 3/2020 | ......... H01L 21/4803 |
| JP | 2021002627 | A | * 1/2021 | ........... H01L 23/055 |

* cited by examiner

ELECTRONIC MODULE AND EQUIPMENT

BACKGROUND OF THE INVENTION

Field of the Invention

The present invention relates to an electronic module and an equipment.

Description of the Related Art

Electronic devices such as image capturing devices have undergone an increased heat generation amount in conjunction with multi-functionalization, sophistication, and the like. Thus, electronic modules containing electronic devices are required to deliver high heat radiation performance. Japanese Patent Laid-Open No. 2015-84377 proposes an electronic module that uses, for a frame member of a substrate, a material delivering excellent heat radiation performance.

Components other than the electronic devices may be mounted on an electronic module for multi-functionalization and sophistication. Japanese Patent Laid-Open No. 2015-84377 does not account for adiabaticity for the components mounted on the electronic module. Components exposed to high heat may be subjected to performance degradation, lifespan reduction, damage, and the like. As a result, the performance of the electronic module may be degraded.

SUMMARY OF THE INVENTION

An aspect of the present invention provides a technique for suppressing heat transfer to components of an electronic module while maintaining heat radiation performance of the electronic module.

According to an embodiment of the present invention, an electronic module comprises: a substrate including a first surface and a second surface on a side opposite to the first surface, the second surface including a first region and a second region surrounding the first region; an electronic device attached to the first surface; a component attached to the first region of the second surface; a lid member positioned to face the electronic device; and a frame member attached to the substrate to support the lid member, wherein a first member and a second member having a higher thermal conductivity than the first member are disposed at least on the second surface, at least a part of the second member is positioned to face the second region, and at least a part of the first member is positioned between the second member and the component.

Further features of the present invention will become apparent from the following description of exemplary embodiments (with reference to the attached drawings).

DESCRIPTION OF THE EMBODIMENTS

Figure 1A:
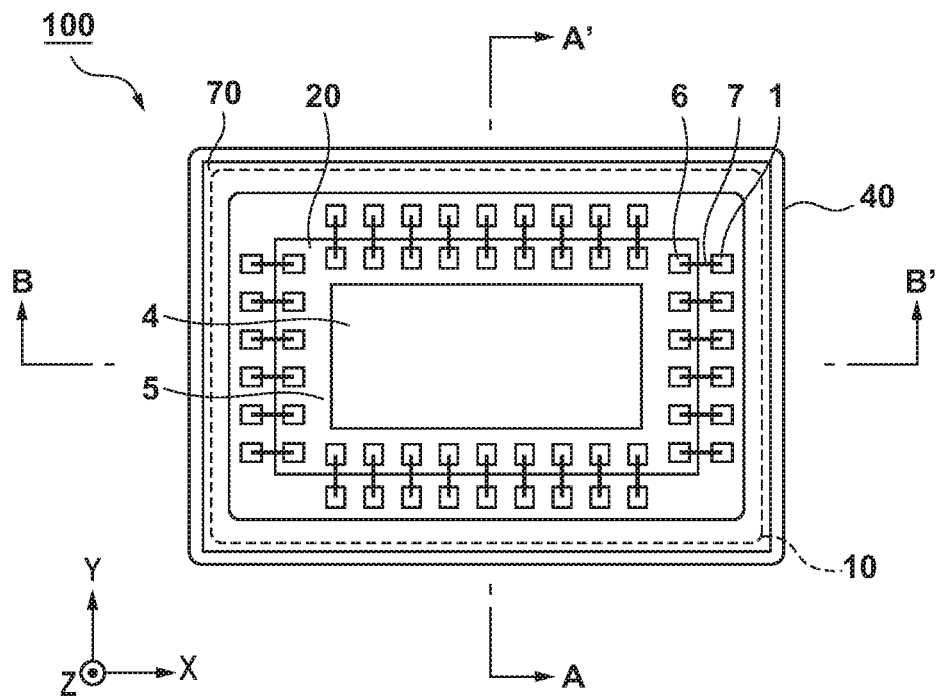
FIGS. 1A and 1B are diagrams illustrating an example of a configuration of an electronic module according to some embodiments.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

First Embodiment

Figure 1B:
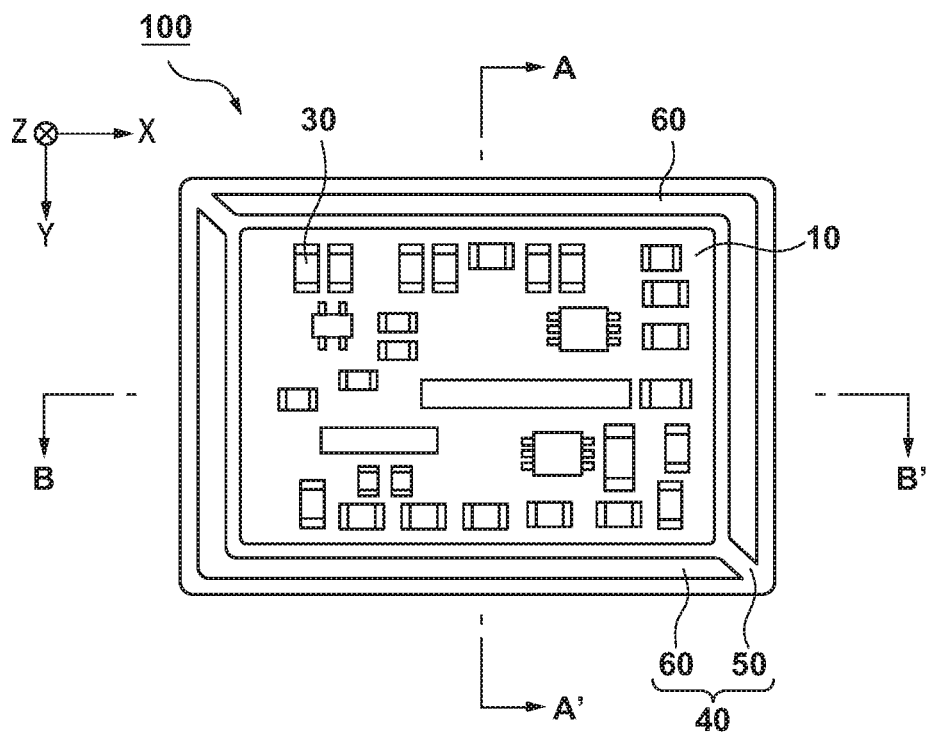
Figure 2A:
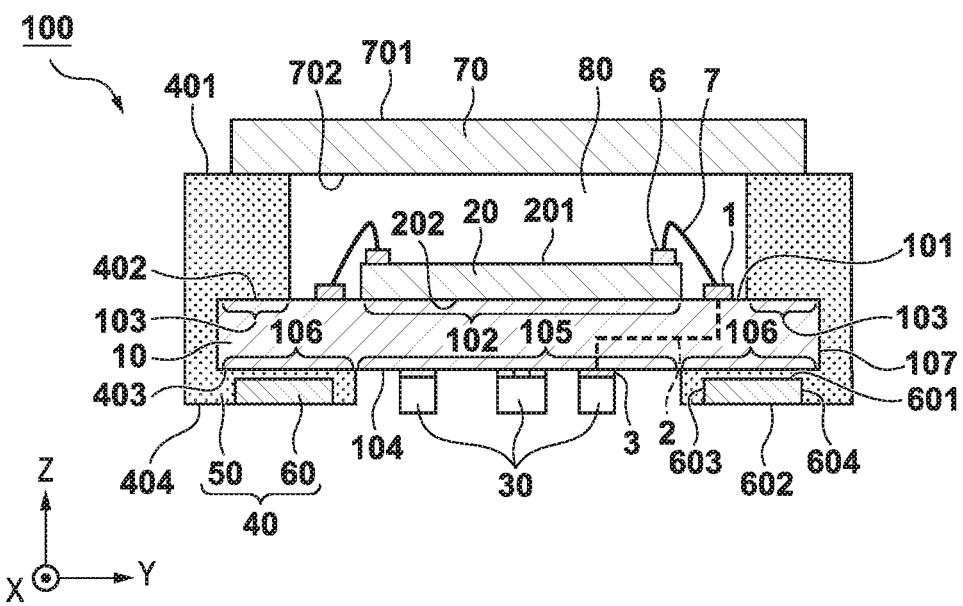
FIGS. 2A and 2B are diagrams illustrating an example of the configuration of the electronic module according to some embodiments.
Figure 2B:
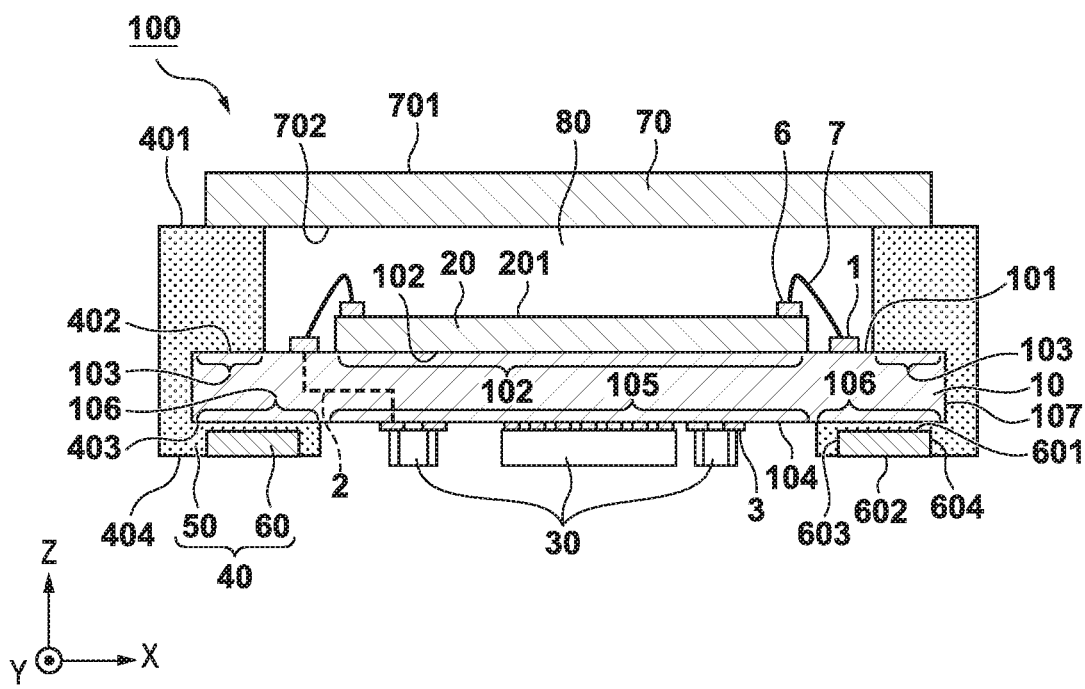

With reference to FIGS. 1A to 2B, an example of a configuration of an electronic module 100 will be described as a first embodiment of the present invention. FIG. 1A is a schematic plan view of the electronic module 100 as viewed from a front side. FIG. 1B is a schematic plan view of the electronic module 100 as viewed from a back side. FIG. 2A is a cross-sectional schematic view of the electronic module 100 taken along line A-A' in FIG. 1A and FIG. 1B. FIG. 2B is a cross-sectional schematic view of the electronic module 100 taken along line B-B' in FIGS. 1A and 1B. An X direction, a Y direction, and a Z direction are illustrated in the drawings.

The electronic module 100 is constituted of a substrate 10, an electronic device 20, one or more components 30, a frame member 40, and a lid member 70. Hereinafter, an example in which the electronic module 100 includes a plurality of components 30 will be described. The frame member 40 includes a low-conductivity member 50 and a high-conductivity member 60. The high-conductivity member 60 has a higher thermal conductivity than the low-conductivity member 50. The names of the low-conductivity member 50 and the high-conductivity member 60 are based on a comparison of the thermal conductivity of the two members and need not indicate that the thermal conductivity is low or high with respect to some other criteria.

The substrate 10 and frame member 40 may function as mount members that mechanically fix and electrically connect the electronic module 100. The lid member 70 may function as an optical member. The electronic device 20 is attached (e.g., fixed) to one side of substrate 10. A surface of the substrate 10 to which the electronic device 20 is attached is referred to as a mounting surface 101. The mounting surface 101 may be referred to as an upper surface, a front surface, an inner surface, or the like. A surface of the substrate 10 on a side opposite the mounting surface 101 is referred to as a rear surface 104. The rear surface 104 may be referred to as a lower surface, a back surface, an outer surface, or the like. In the present embodiment, the mounting surface 101 and the rear surface 104 are parallel to each other. Herein, two objects being parallel to each other also include the two objects being substantially parallel to each other. Being substantially parallel means that the angle formed between the two objects is, for example, −5° or more and 5° or less. Similarly, in the present specification, two objects being orthogonal to each other also include the two objects being substantially orthogonal to each other. Being substantially orthogonal means that the angle formed between the two objects is, for example, 85° or more and 95° or less.

The components 30 are attached (e.g., fixed) to the rear surface 104 of substrate 10. The frame member 40 is attached (e.g., fixed) to the outer periphery of the substrate 10 to surround the electronic device 20 and the components 30. Here, the frame member 40 surrounding the electronic device 20 and the components 30 means that the frame member 40 surrounds the periphery of the electronic device 20 or the components 30 in a plane parallel to the mounting surface 101. The outer periphery of the substrate 10 includes portions of the substrate 10 proximate to sides including boundaries between: outer edges 107 of the substrate 10; and the mounting surface 101 and/or the rear surface 104.

The lid member 70 is attached (e.g., fixed) to the frame member 40. The lid member 70 is arranged to face the electronic device 20. The lid member 70 is supported by the frame member 40. The electronic device 20 is sealed in an internal space 80 defined by the substrate 10, the frame member 40, and the lid member 70. The lid member 70 has an outer surface 701 located on a side opposite to the substrate 10 and an inner surface 702 located on the same side as the substrate 10. The outer surface 701 may be referred to as an upper surface, a front surface, or the like. The inner surface 702 may be referred to as a lower surface, a back surface, or the like.

The X direction and the Y direction are directions parallel to the mounting surface 101 and the rear surface 104 of the substrate 10 and to the outer surface 701 and the inner surface 702 of the lid member 70. The Z direction is a direction orthogonal to these surfaces. The typical electronic device 20 and the typical electronic module 100 are rectangular in the XY plane. The dimensions of the electronic device 20 and the electronic module 100 are smaller in the Z direction than in the X direction and the Y direction. Thus, the electronic device 20 and the electronic module 100 are shaped generally like flat plates.

The substrate 10 has a flat plate shape. The substrate 10 includes internal terminals 1 on the mounting surface 101 and external terminals 3 on the rear surface 104. The internal terminals 1 and the external terminals 3 are electrically connected to one another via a filling portion 2 embedded in the substrate 10 as an internal line. The mounting surface 101 of the substrate 10 includes a central region 102 to which the electronic device 20 is attached and a peripheral region 103 to which the frame member 40 is attached. The peripheral region 103 is located around the central region 102. The mounting surface 101 of the substrate 10 may include an intermediate region between the central region 102 and the peripheral region 103. The rear surface 104 of the substrate 10 has a central region 105 to which the components 30 are attached and a peripheral region 106 to which the frame member 40 is attached. The peripheral region 106 is located around the central region 105.

The substrate 10 can be formed by molding or cutting, stacking of plate materials, or the like. The substrate 10 may be an insulator to ensure insulation of the internal terminals 1 and the external terminals 3. The substrate 10 may be a flexible substrate such as a polyimide substrate; or a rigid substrate such as a glass epoxy substrate, a composite substrate, a glass composite substrate, a bakelite substrate, a ceramic substrate, or the like. In particular, a glass epoxy substrate may be used as the substrate 10. Because the glass epoxy substrate has a moderate strength compared to the flexible substrate, using the glass epoxy substrate facilitates fixation of the frame member 40 and the lid member 70, and as a result, manufacture of the electronic module 100 is facilitated. Additionally, compared to the use of a ceramic substrate, the use of the glass epoxy substrate enables a reduction in the weight of the electronic module 100. In a case where the substrate 10 is a glass epoxy substrate or the like, an insulating film (solder resist) for protecting the inner layer line pattern of the filling portion 2 may be formed on the mounting surface 101 and the rear surface 104 of the substrate 10. In a case where the insulating film is formed, surfaces of the insulating film are used as the mounting surface 101 and the rear surface 104. The thickness of the insulating film may be, for example, 40 μm or less.

The electronic device 20 may be any type of electronic device. For example, the electronic device 20 may be an optical device. The electronic device 20 according to the present embodiment includes a main region 4 and a sub-region 5. Typically, the main region 4 is located in the center of the electronic device 20, and the sub-region 5 is located around the main region 4. In a case where the electronic device 20 is an image capturing device such as a CCD image sensor or a CMOS image sensor, the main region 4 is an image capturing region. In a case where the electronic device 20 is a display device such as a liquid crystal display or an EL display, the main region 4 is a display region. In a case where the electronic device 20 is an image capturing device, a surface 201 of the electronic device 20 facing the lid member 70 is used as a light incident surface. The light incident surface may include an outermost layer of a multi-layer film provided on a semiconductor substrate including a light receiving surface. The multi-layer film may include: a layer including an optical function such as a color filter layer, a microlens layer, an antireflective layer, or a light shielding layer; a layer including a mechanical function such as a planarized layer; and a layer including a chemical function such as a passivation layer. The sub-region 5 is provided with a driver circuit for driving the main region 4 or a signal processing circuit processing signals from the main region 4 (or signals to the main region 4). In a case where the electronic device 20 is a semiconductor device, such a circuit can be monolithically formed. The sub-region 5 is provided with electrodes 6 (electrode pads) for communicating signals between the electronic device 20 and the outside. In a case where the electronic device 20 is an electronic device in which two or more electronic devices are stacked, the electronic device 20 may have a stacked configuration in which an electronic device responsible for the sub-region 5 is located beneath the electronic device responsible for the main region 4. The electronic device 20 is fixed by an adhesive (not shown) applied between the central region 102 of the substrate 10 and a rear surface 202 of the electronic device 20, as illustrated in FIGS. 2A and 2B.

The electrodes 6 of the electronic device 20 and the internal terminals 1 of the substrate 10 are electrically connected to one another via connecting conductors 7. In the present embodiment, the electrodes 6 and the internal terminals 1 are connected together by wire bonding, and the connecting conductors 7 are metal wires (bonding wires). Alternatively, the connection between each of the electrodes 6 and the corresponding internal terminal 1 may be a flip-chip connection. With the wire bonding connection, the internal terminals 1 are located in an intermediate region between the central region 102 and the peripheral region 103. With the flip-chip connection, the electrodes 6 are provided on the rear surface 202 of the electronic device 20, and the internal terminals 1 and the connecting conductors 7 are located on an orthographic region of the rear surface 202 of the electronic device 20.

The component 30 is fixed to the external terminal 3 via a conductive material (not illustrated). The external terminal 3 is located in the central region 105 of the rear surface 104 of the substrate 10. The components 30 may be any type of components. The components 30 may be electronic components, for example, passive components such as connectors, resistors, capacitors, or diodes; active components such as transistors; or integrated circuits. In the present embodiment, the components 30 are attached only to central region 105 of rear surface 104. In addition, the component 30 may be attached to the peripheral region 106. Components for surface mounting may be used as the components 30. Examples of types of components for surface mounting include: ceramic capacitors, organic capacitors of tantalum or the like, chip resistors, B to B connectors, regulator ICs for power supply, common mode filter coils, temperature measurement ICs, and EPROMs. These components 30 improve the functionality and performance of the electronic module 100. Additionally, in a case where connectors are provided as the components 30, the electronic module 100 can be readily incorporated into a housing or the like of electronic equipment. In this embodiment, a plurality of types of components are attached to the central region 105 of the rear surface 104 of the substrate 10. The electronic module 100 configured in this way is incorporated into a housing to form electronic equipment.

The components 30 may be attached to substrate 10 at any point in time before, during, or after fixation of the electronic device 20, the frame member 40, and the lid member 70 to the substrate 10. The components 30 may be attached to the substrate 10 before the stage of preparation of the substrate 10, that is, before the electronic device 20, the frame member 40, and the lid member 70 are attached to the substrate 10. This allows the suppression of, for example, mixture of foreign material in an environment in which the components 30 are attached (e.g., a reflow soldering environment).

The frame member 40 is attached to the outer periphery of the substrate 10 to surround the electronic device 20 and the components 30. Specifically, the frame member 40 is fixed to each of the peripheral region 103 of the mounting surface 101 and the peripheral region 106 of the rear surface 104. As a result, the frame member 40 is in contact with each of the peripheral region 103 of the mounting surface 101 and the peripheral region 106 of the rear surface 104. Integrated formation of a portion formed in the peripheral region 103 of the mounting surface 101 and a portion formed in the peripheral region 106 of the rear surface 104 is easier than separated formation of these portions. Thus, the frame member 40 may be an integrated frame member fixed to the peripheral region 103 of the mounting surface 101, the peripheral region 106 of the rear surface 104, and the outer edges 107 of the substrate 10. In addition, even in the case of an integrated frame member, the frame member 40 may be fixed exclusively to (i.e., may be in contact exclusively with) the peripheral region 106 of the rear surface 104 and need not be fixed to (i.e., need not be in contact with) the peripheral region 103 and/or the outer edges 107 of the mounting surface 101. Additionally, the frame member 40 may be fixed exclusively to (i.e., may be in contact exclusively with) the peripheral region 106 of the rear surface 104 and the outer edges 107 and need not be fixed to (that is, need not be in contact with) the peripheral region 103 of the mounting surface 101. Instead of the frame member 40 contacting a part of the substrate 10 (e.g., the peripheral region 106), the frame member 40 may be attached to a part of the substrate 10 (e.g., the peripheral region 106) via an adhesive.

An upper surface 401 of the frame member 40 is located on a side of the mounting surface 101. The lid member 70 is fixed to the upper surface 401 of the frame member 40. A lower surface 404 of the frame member 40 is located on a side of the rear surface 104. The frame member 40 includes: a surface 402 fixed to the peripheral region 103 of the mounting surface 101 of the substrate 10; and a surface 403 fixed to the peripheral region 106 of the rear surface 104.

The frame member 40 may be formed using a ceramic, a metal, or a resin material. Examples of the metal material include aluminum, aluminum alloys, copper, copper alloys, and iron alloys. Stainless steel and iron alloys containing chromium, nickel, or cobalt may be used. For example, SUS430 corresponding to a ferritic stainless steel, SUS304 corresponding to an austenitic stainless steel, a 42 alloy, a Kovar, or the like may be used. Examples of the resin material include epoxy-based resins, acrylic resins, silicone-based resins, and vinyl-based resins. Examples of the organic material include a dry solidification type obtained by evaporation of a solvent, a chemical reaction type cured by optical or thermal polymerization of molecules, a thermo-fusion (hot melt) type solidified by solidification of a melted material, and the like. As the material of the frame member 40, a photo-curing resin cured by ultraviolet light or visible light, or a thermosetting resin cured by heat may be used.

The lid member 70 functions to protect the electronic device 20. In a case where the electronic device 20 is an image capturing device or a display device that handles light, the lid member 70 is required to be transparent to the light (typically visible light). Examples of a material for the lid member 70 as described above include plastic, glass, and quartz. An antireflective coating or an infrared-ray blocking coating may be provided on a surface of the lid member 70. The inner surface 702 of the lid member 70 is fixed to the upper surface 401 of the frame member 40 by an adhesive not illustrated. The internal space 80 is formed between the substrate 10 and the frame member 40 and the lid member 70. The electronic device 20 is sealed in the internal space 80.

A detailed configuration of the frame member 40 will be described below. The frame member 40 includes the low-conductivity member 50 and the high-conductivity member 60. The high-conductivity member 60 has a higher thermal conductivity than the low-conductivity member 50. The thermal conductivity of the high-conductivity member 60 may be, for example, 1.0 W/m·K or higher, or even 10 W/m·K or higher. The high-conductivity member 60 may be a metal in view of thermal conductivity, processing accuracy, and the like. In a case where the high-conductivity member 60 is a metal, the high-conductivity member 60 is electrically separated from the electronic device 20 by the substrate 10, which is insulative. The thermal conductivity of the low-conductivity member 50 may be, for example, 1.0 W/m·K or lower. The low-conductivity member 50 may be a resin in view of thermal conductivity, processing accuracy, ease of formation, and the like. In a case where the low-conductivity member 50 is a resin, the low-conductivity member 50 may be formed in tight contact with the substrate 10 and the high-conductivity member 60 by a resin molding method such as a transfer molding method. Alternatively, the low-conductivity member 50 may be fixed to the substrate 10 and the high-conductivity member 60 using an adhesive. Fixation based on the resin molding method is easier than the method of fixation with an adhesive.

The high-conductivity member 60 is positioned to face the peripheral region 106 of the rear surface 104. Herein, an object being positioned to face a surface may mean that a normal vector from a part of a surface extends through the object. In the present embodiment, the high-conductivity member 60 as a whole is positioned to face the peripheral region 106 of the rear surface 104. Since the frame member 40 includes the high-conductivity member 60 at such a position, a portion of the frame member 40 facing the peripheral region 106 of the rear surface 104 has a higher thermal conductivity than the other portions of the frame member 40. Thus, a portion of the electronic module 100 located close to the components 30 delivers improved heat radiation performance.

A part of the low-conductivity member 50 is positioned between the high-conductivity member 60 and the components 30. In other words, of the surfaces of the high-conductivity member 60, a surface 603 located on a side of the components 30 is covered by the low-conductivity member 50. In the present embodiment, of the surfaces of the high-conductivity member 60, a surface 604 located on a side opposite to the components 30; and a surface 601 on a side of the substrate 10 are also covered by the low-conductivity member 50. Of the surfaces of the high-conductivity member 60, a surface 602 located on a side opposite to the substrate 10 is exposed to the outside and constitutes a part of the external form of the electronic module 100. The high-conductivity member 60 being thus exposed to the outside improves a thermal conduction effect compared to the high-conductivity member 60 being not exposed to the outside because in this case, the high-conductivity member 60 can directly contact a heat radiator or the like outside the electronic module 100. Since a part of the low-conductivity member 50 is positioned between the high-conductivity member 60 and the components 30, heat emitted to the outside of the electronic module 100 through the high-conductivity member 60 can be inhibited from being transferred to the components 30.

As illustrated in FIG. 1B, the high-conductivity member 60 includes two L-shaped portions. Each of the two L-shaped portions has a shape in which portions of each L-shaped portion each extending along one side of the rear surface 104 of the substrate 10 are coupled at or near a corner of the rear surface 104. The length of the portion of the L-shaped portion extending along one side of the rear surface 104 of the substrate may be greater than the half, 80%, or 90% of the length of the one side. By arranging and extending the high-conductivity member 60 along the four sides of the rear surface 104, the heat radiation effect of the high-conductivity member 60 is improved. Instead of including the two L-shaped portions, the high-conductivity member 60 may include one O-shaped (annular) portion or four I-shaped (rod-like) portions.

The frame member 40 does not include the high-conductivity member 60 in a portion of the mounting surface 101 of the substrate 10 facing the peripheral region 103. Thus, this portion of the frame member 40 has improved adiabaticity. As a result, heat generated by the electronic device 20 can be inhibited from being transferred through the frame member 40 to the lid member 70. Accordingly, thermal expansion of the lid member 70 can be suppressed that is caused by an increased temperature of the lid member 70.

In a case where the electronic device 20 is heated in a wire bonding step in which the electrodes 6 of the electronic device 20 and the internal terminals 1 are connected by the connecting conductors 7, the electrodes 6 may be heated by a heater or the like via a metal stage disposed immediately below the high-conductivity member 60. This enables efficient heat transfer to the electronic device 20.

Figure 3:
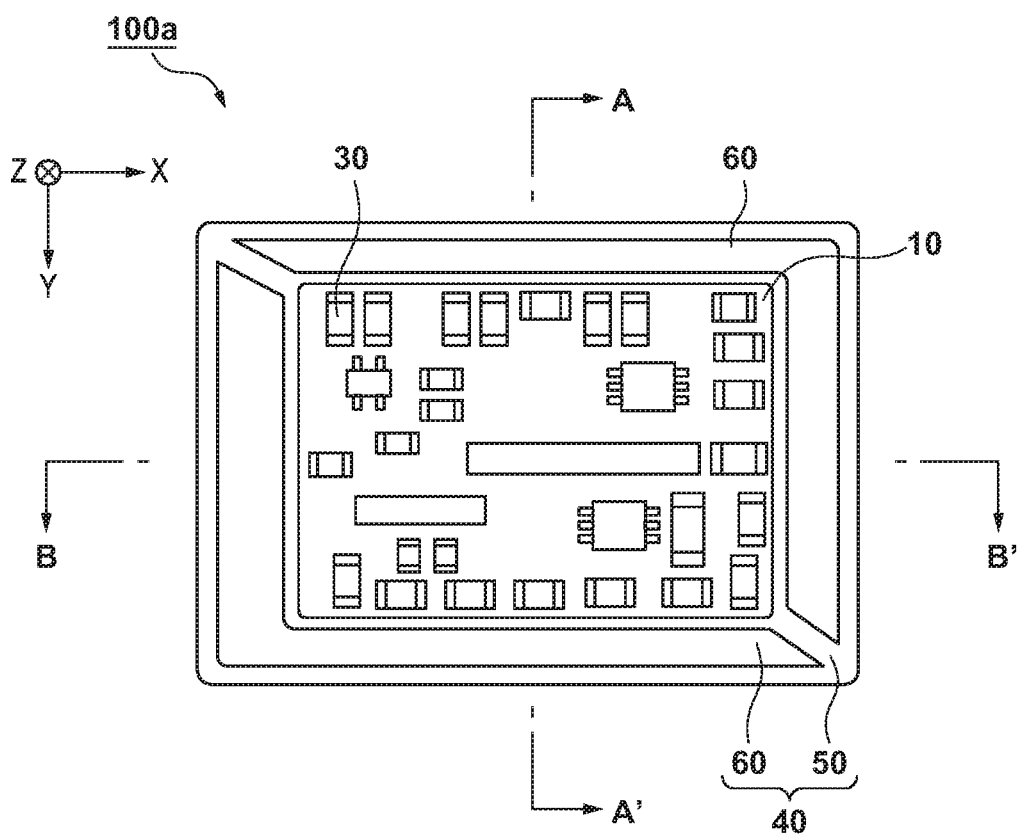
FIG. 3 is a diagram illustrating an example of a configuration of an electronic module according to some embodiments.
Figure 4A:
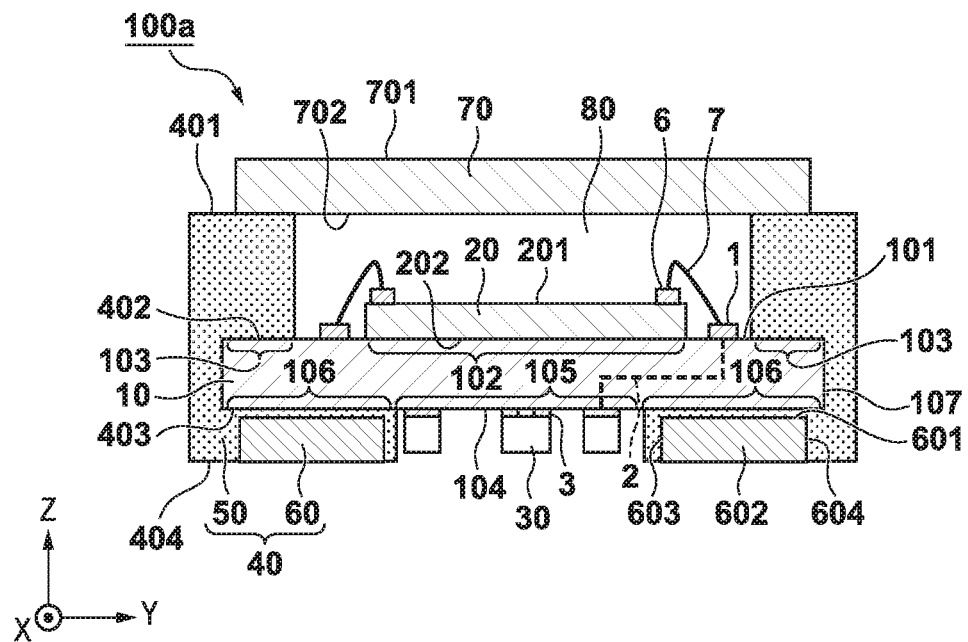
FIGS. 4A and 4B are diagrams illustrating an example of the configuration of the electronic module according to some embodiments.
Figure 4B:
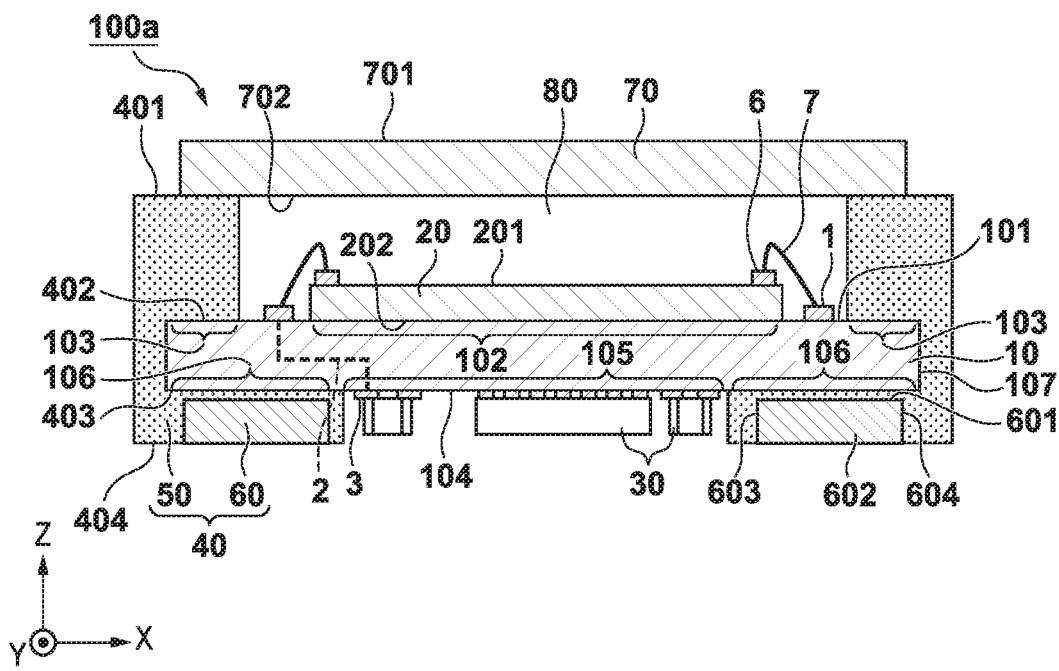

With reference to FIGS. 3 to 4B, an electronic module 100a, which is a variation example of the electronic module 100 described above, will be described. FIG. 3 is a schematic plan view of the electronic module 100a as viewed from the back. FIG. 4A is a cross-sectional schematic view of the electronic module 100a at a position similar to that in FIG. 2A. FIG. 4B is a cross-sectional schematic view of the electronic module 100a at a position similar to that in FIG. 2B. A schematic plan view of the electronic module 100a as viewed from the front is similar to FIG. 1A and is thus omitted.

The electronic module 100a differs from the electronic module 100 in the region where the high-conductivity member 60 of the frame member 40 is formed. Specifically, the high-conductivity member 60 of the electronic module 100a is formed to be wide in a direction toward the center of the rear surface 104. As a result, the high-conductivity member 60 of the electronic module 100a includes a portion overlapping the electronic device 20 in a plan view of the mounting surface 101. In this way, by thus forming the wide high-conductivity member 60, heat generated by the electronic device 20 can be released more efficiently. On the other hand, in the electronic module 100, the region in which the components 30 can be mounted is large in area.

Furthermore, the electronic module 100a differs from the electronic module 100 in the thickness, in the Z direction, of a portion of the frame member 40 facing the peripheral region 106 of the rear surface 104. In electronic module 100a, the thickness, in the Z direction, of the portion of the frame member 40 facing the peripheral region 106 is greater than the height of each of the components 30. The height of the component 30 is a height with reference to the rear surface 104. As described above, the Z direction is a direction orthogonal to the rear surface 104. The thickness of this portion of the frame member 40 is greater than the height of each component 30, resulting in a structure in which the components 30 are not easily contacted from outside the electronic module 100a. Accordingly, damage caused by, for example, contact of the components 30 can be suppressed, thus improving the yield of the electronic module 100a.

On the lower surface 404 of the frame member 40 of each of the electronic module 100 and the electronic module 100a, the low-conductivity member 50 and the high-conductivity member 60 are flush with each other. The frame member 40 having such a structure can be easily formed. Additionally, complication of the structure of the heat radiator or the like outside the electronic module 100a is prevented, thus allowing thermal conduction to be facilitated. This also improves the yield of the electronic module 100 and the electronic module 100a.

Figure 5A:
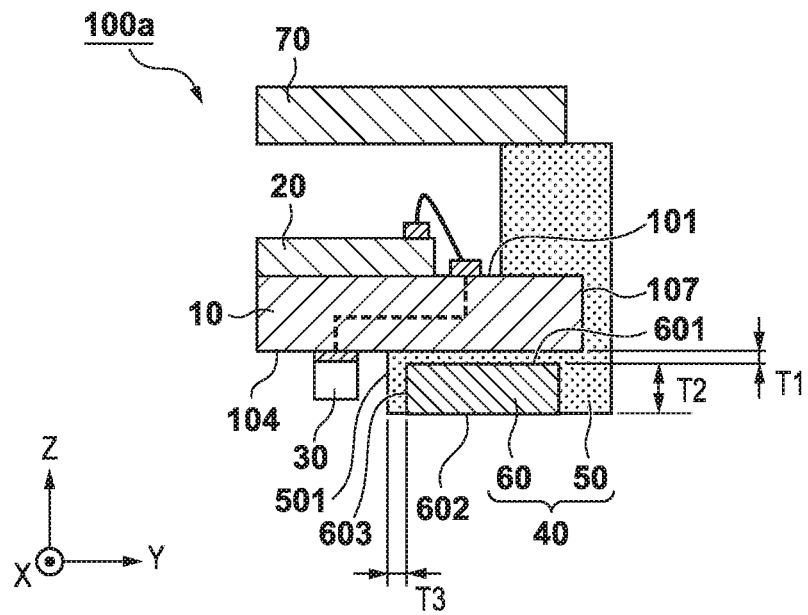
FIGS. 5A and 5B are diagrams illustrating an example of the configuration of the electronic module according to some embodiments.
Figure 5B:
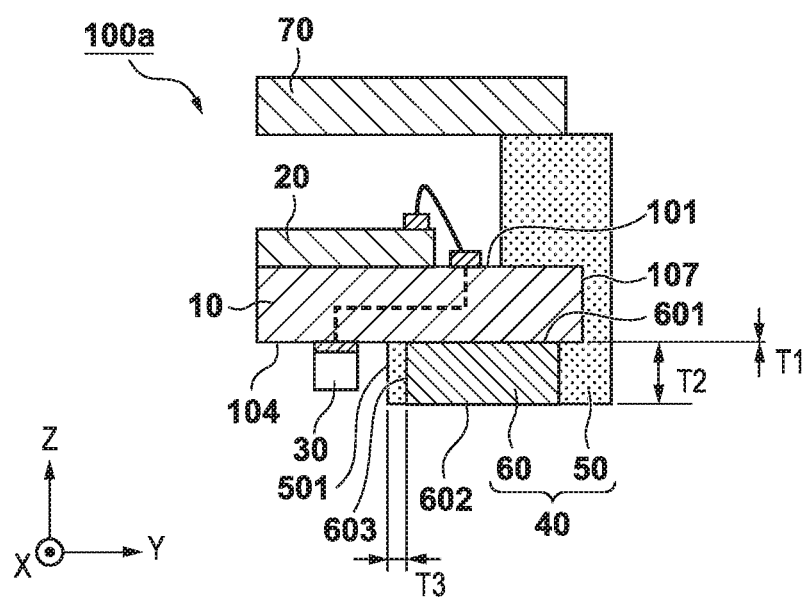

With reference to FIGS. 5A and 5B, the relationship between the dimensions of the low-conductivity member 50 and the high-conductivity member 60 will be described in further detail. FIGS. 5A and 5B are enlarged views of a part of FIG. 4A. The shortest distance between the high-conductivity member 60 and the rear surface 104 in the Z direction is designated as T1. T1 equals the shortest distance between the surface 601 of the high-conductivity member 60 and the rear surface 104. The thickness of the high-conductivity member 60 in the Z direction is designated as T2. T2 equals the shortest distance between the surface 601 and the surface 602 of the high-conductivity member 60. T3 denotes the thickness of a portion of the low-conductivity member 50 located between the high-conductivity member 60 and the components 30 in the normal direction (opposite direction in the Y direction) of the surface 603 of the high-conductivity member 60. T3 equals the shortest distance between a surface 501 of the low-conductivity member 50 facing the component 30; and the surface 603 of the high-conductivity member 60.

The high-conductivity member 60 of the electronic module 100a is formed to satisfy T2>T1. A reduction in T1 allows the high-conductivity member 60 to be located closer to the substrate 10. This improves the thermal conduction effect compared to the case of T2<T1. T1=0 may be set. In this case, as shown in FIG. 5B, the high-conductivity member 60 (in particular, the surface 601 of the high-conductivity member 60) contacts the peripheral region 106 of the rear surface 104. Accordingly, the thermal conduction effect is further improved.

The filling portion 2, used as a heat radiation via or a heat radiation pattern, is disposed at or near a portion of the rear surface 104 contacted by the high-conductivity member 60 and at least one of a portion of the mounting surface 101 contacted by the electronic device 20 and a portion of the mounting surface 101 contacted by the internal terminals 1. The filling portions 2 may be connected to each other. The presence of the filling portion 2 improves the thermal conduction effect via the high-conductivity member 60.

The high-conductivity member 60 of the electronic module 100a is formed to satisfy T3>T1. Heat transferred to the high-conductivity member 60 can be inhibited from reaching the components 30 due to the presence of a part of the low-conductivity member 50 between the high-conductivity member 60 and the components 30. Furthermore, thickening this portion of the low-conductivity member 50 allows improvement of an effect suppressing heat transfer to the component 30.

T1 may be 70 μm or less. By setting the T1 to 70 μm or less, thermal conduction from the substrate 10 to the high-conductivity member 60 can be effectively improved. T2 may be 0.2 mm or more. By setting T2 to 0.2 mm or more, sufficient thermal conductivity can be ensured. T2 may be 2 mm or less. By setting T2 to 2 mm or less, an increase in the size of the electronic module 100a can be suppressed. T3 may be 70 μm or more. By setting T3 to 70 μm or more, thermal conduction from the high-conductivity member 60 to the components 30 can be effectively suppressed. T3 may be 1 mm or less. By setting T3 to 1 mm or less, a region large enough to mount the components 30 can be secured.

Second Embodiment

Figure 6A:
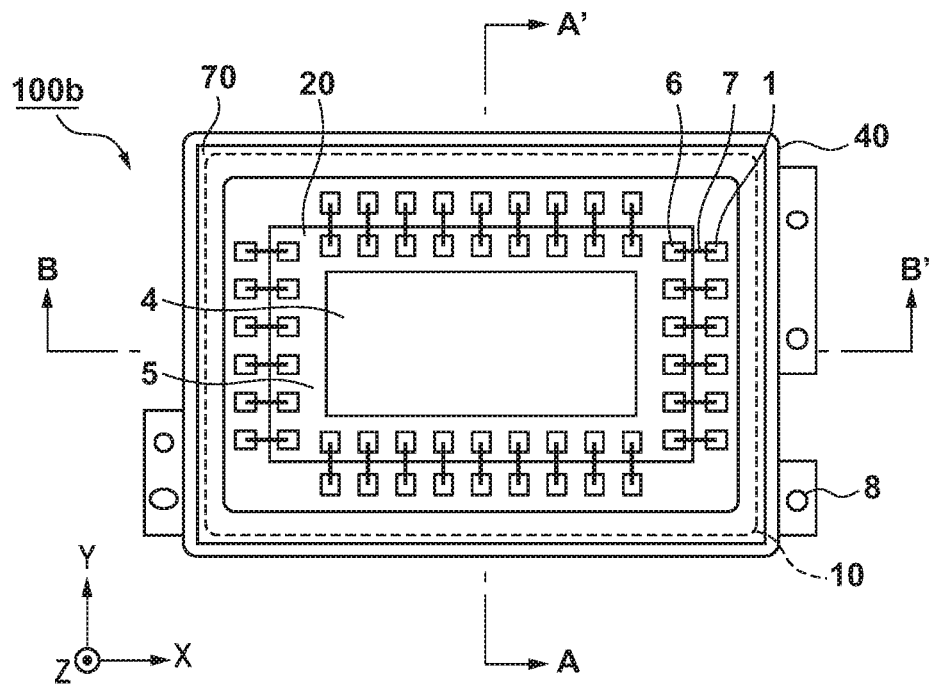
FIGS. 6A and 6B are diagrams illustrating an example of a configuration of an electronic module according to some embodiments.
Figure 6B:
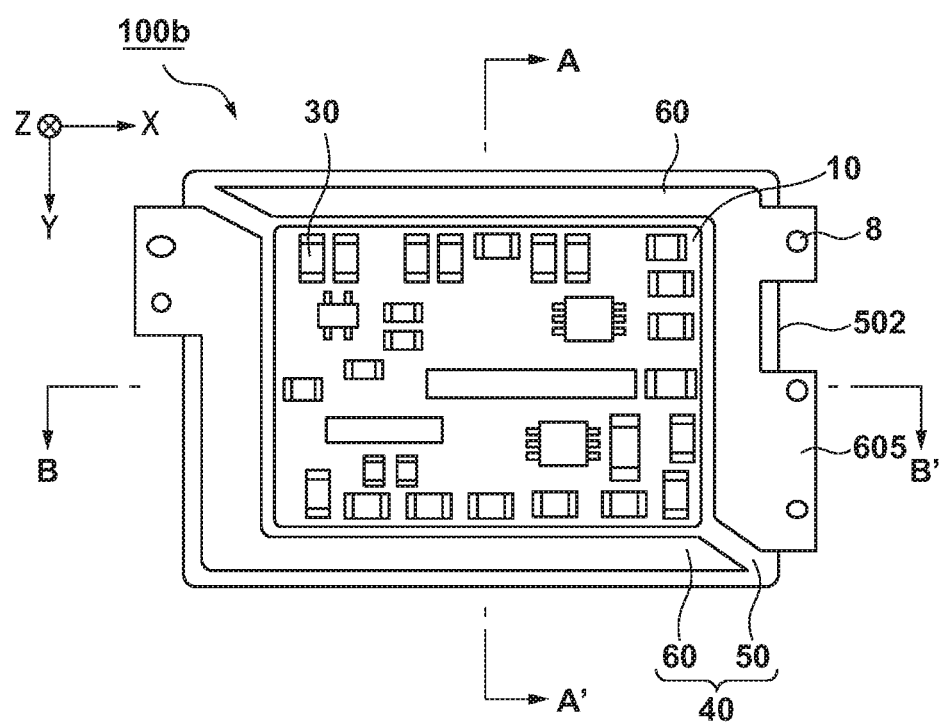
Figure 7A:
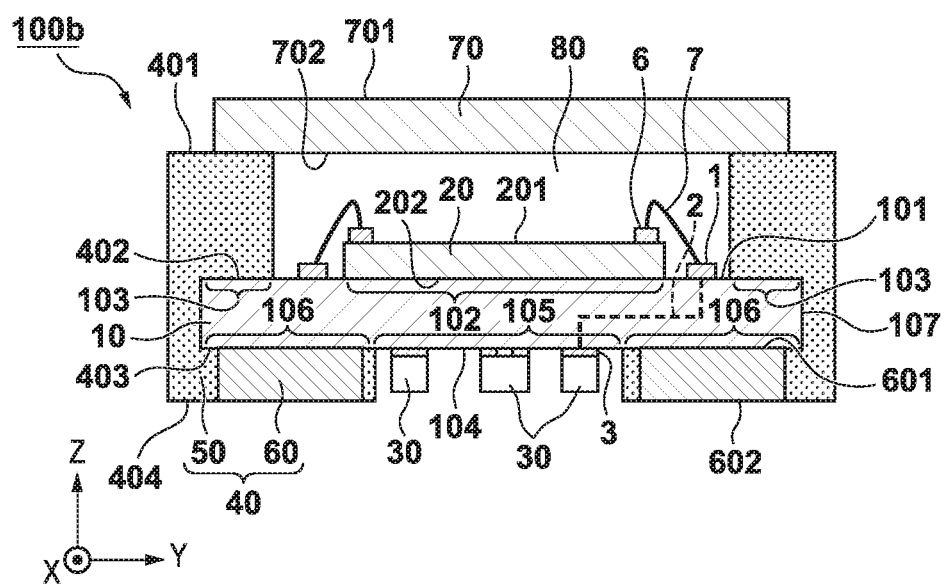
FIGS. 7A and 7B are diagrams illustrating an example of the configuration of the electronic module according to some embodiments.
Figure 7B:
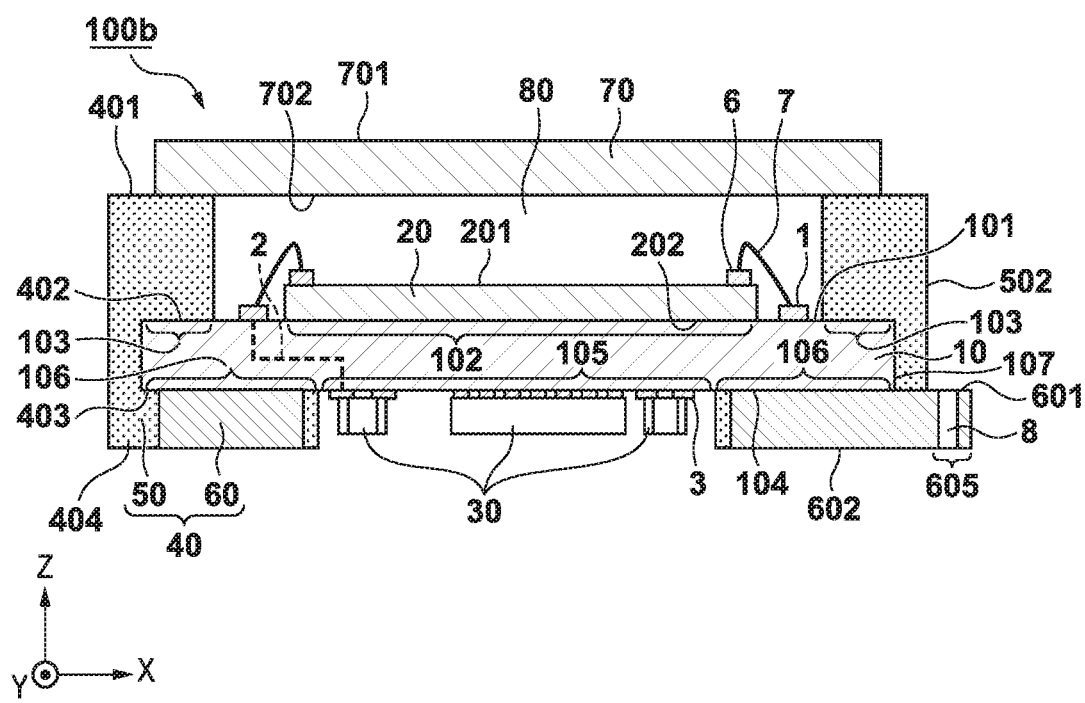

With reference to FIGS. 6A to 7B, an example of a configuration of an electronic module 100b will be described as a first embodiment of the present invention. FIG. 6A is a schematic plan view of electronic module 100b as viewed from the front side. FIG. 6B is a schematic plan view of the electronic module 100b as viewed from the back side. FIG. 7A is a cross-sectional schematic view of the electronic module 100b taken along line A-A' of FIGS. 6A and 6B. FIG. 7B is a cross-sectional schematic view of the electronic module 100b taken along line B-B' of FIGS. 6A and 6B.

The electronic module 100b differs from the electronic module 100a in the shape of the frame member 40. The electronic module 100b may otherwise be similar to the electronic module 100a, and thus redundant description of the electronic module 100b is omitted. As illustrated in FIGS. 6B and 7B, the high-conductivity member 60 of the electronic module 100b includes a portion 605 extending beyond a side surface 502 on an outer side of the low-conductivity member 50 in a plan view of the mounting surface 101. Thus, in the electronic module 100b, only a part of the high-conductivity member 60 is positioned to face the peripheral region 106 of the rear surface 104. The high-conductivity member 60 includes, in the portion 605, a through hole 8 extending from the surface 601 to the surface 602. The through hole 8 can be used as a hole for screwing through which the electronic module 100b is fixed to, for example, the housing of the electronic equipment or used as a hole for positioning. The high-conductivity member 60 includes the portion 605 and thus has a further increased heat capacity, thus improving the thermal conduction effect.

Figure 8A:
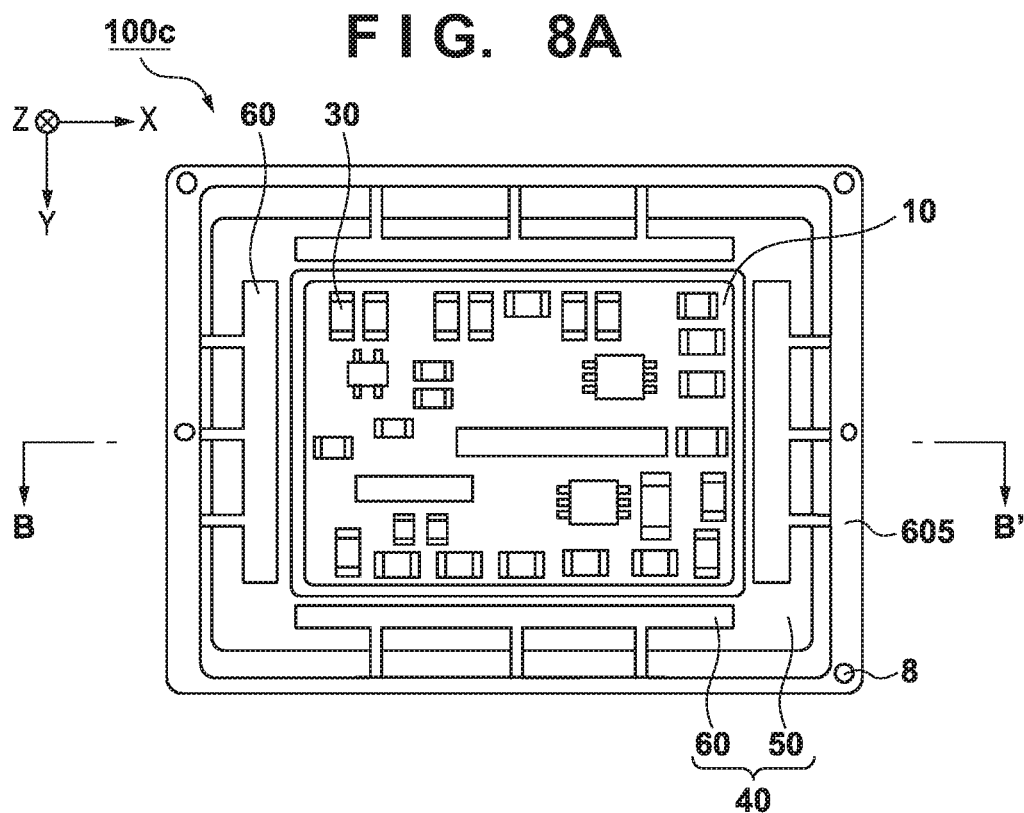
FIGS. 8A and 8B are diagrams illustrating an example of a configuration of an electronic module according to some embodiments.
Figure 8B:
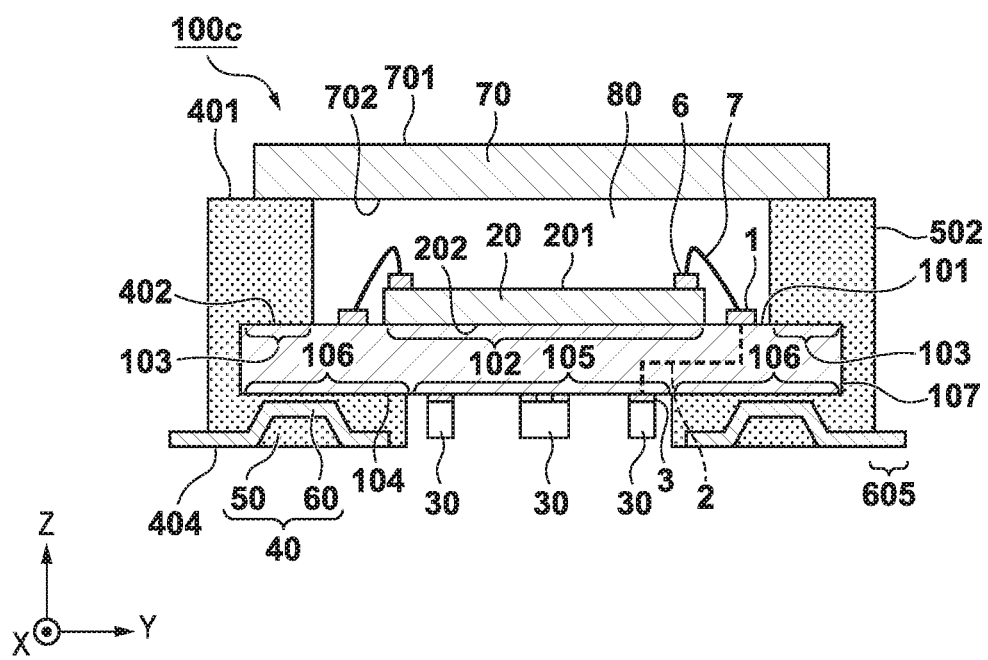

With reference to FIGS. 8A and 8B, an electronic module 100c corresponding to a variation example of the electronic module 100b described above, is described. FIG. 8A is a schematic plan view of the electronic module 100c as viewed from the back. FIG. 8B is a cross-sectional schematic view of the electronic module 100c at a position similar to that in FIG. 7B. The electronic module 100c differs from the electronic module 100b in the shape of the high-conductivity member 60 of the frame member 40.

The high-conductivity member 60 of the electronic module 100c has a bent shape. The high-conductivity member 60 includes: a portion located proximate to or in contact with the rear surface 104 of the substrate 10; and a portion separated from the rear surface 104 and located close to or forming a part of the lower surface 404 of the frame member 40. As is the case with the electronic module 100b, in the electronic module 100c, the high-conductivity member 60 includes the portion 605 extending beyond the side surface 502 on an outer side of the low-conductivity member 50 in a plan view of the mounting surface 101, and the portion 605 includes the through hole 8. The portion 605 extending beyond the side surface 502 on an outer side of the low-conductivity member 50 has an annular shape outside the low-conductivity member 50. The portion required for thermal conduction can be selectively located proximate to the rear surface 104 of the substrate 10, thus improving the thermal conduction effect.

Figure 9A:
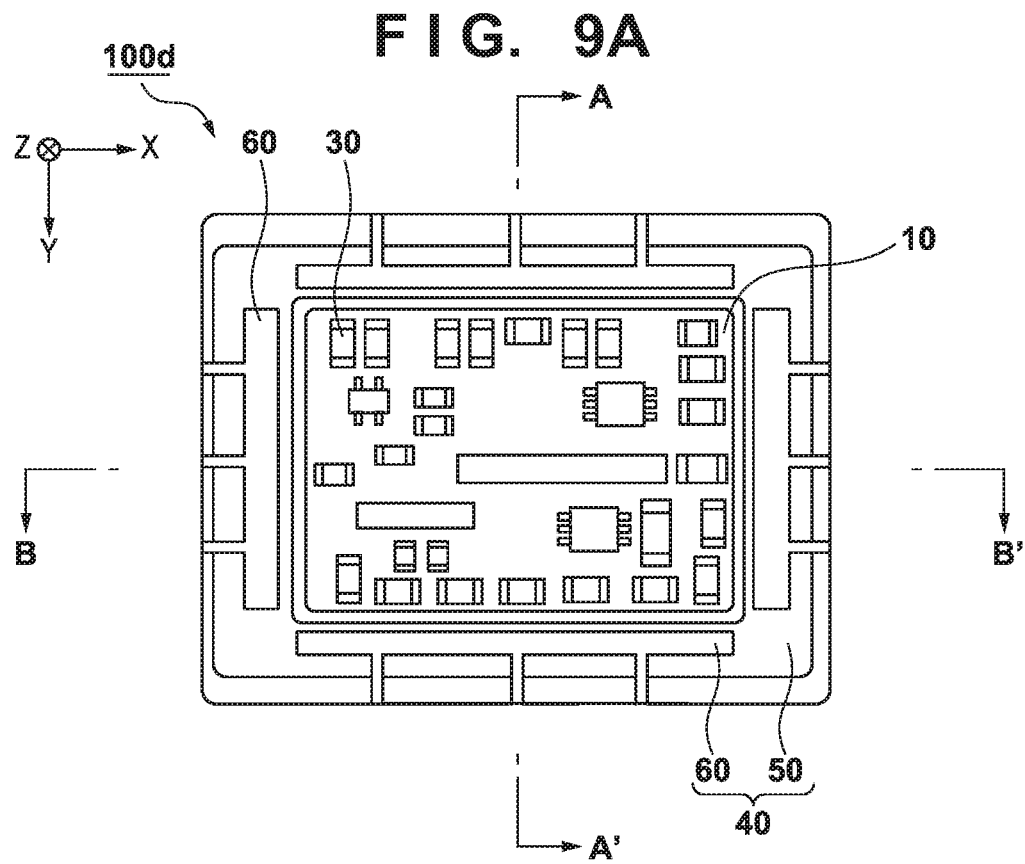
FIGS. 9A and 9B are diagrams illustrating an example of a configuration of an electronic module according to some embodiments.
Figure 9B:
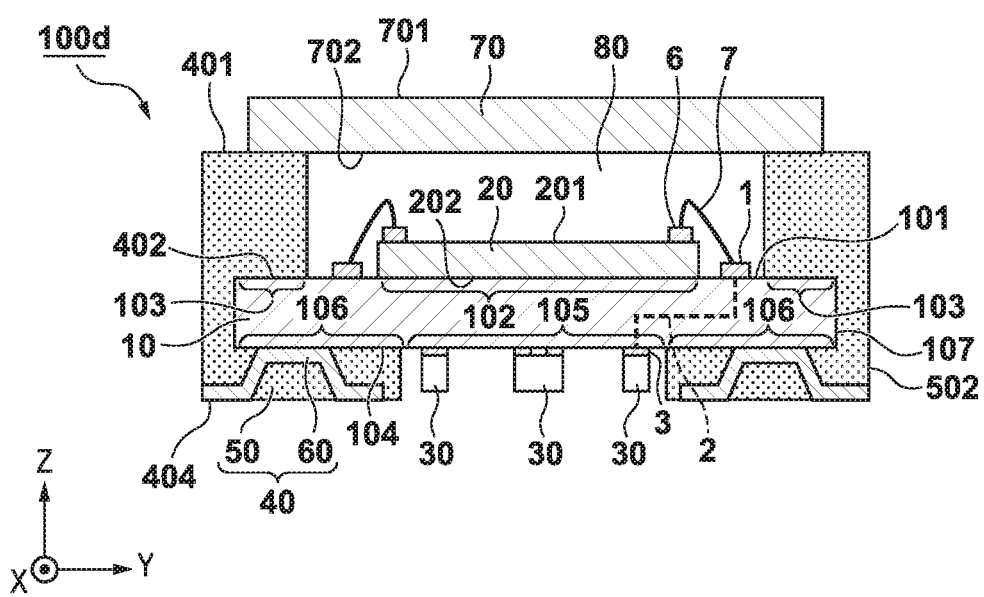

With reference to FIGS. 9A and 9B, an electronic module 100d corresponding to a variation example of the electronic module 100c described above will be described. FIG. 9A is a schematic plan view of the electronic module 100d as viewed from the back. FIG. 9B is a cross-sectional schematic view of the electronic module 100d at a position similar to that in FIG. 8B. The electronic module 100d differs from the electronic module 100c in the shape of the high-conductivity member 60 of the frame member 40. Specifically, the high-conductivity member 60 of the electronic module 100d does not include a portion extending beyond the side surface 502 on an outer side of the low-conductivity member 50 in a plan view of the mounting surface 101. This allows electronic module 100d to be miniaturized in comparison to electronic module 100c.

Third Embodiment

Figure 10A:
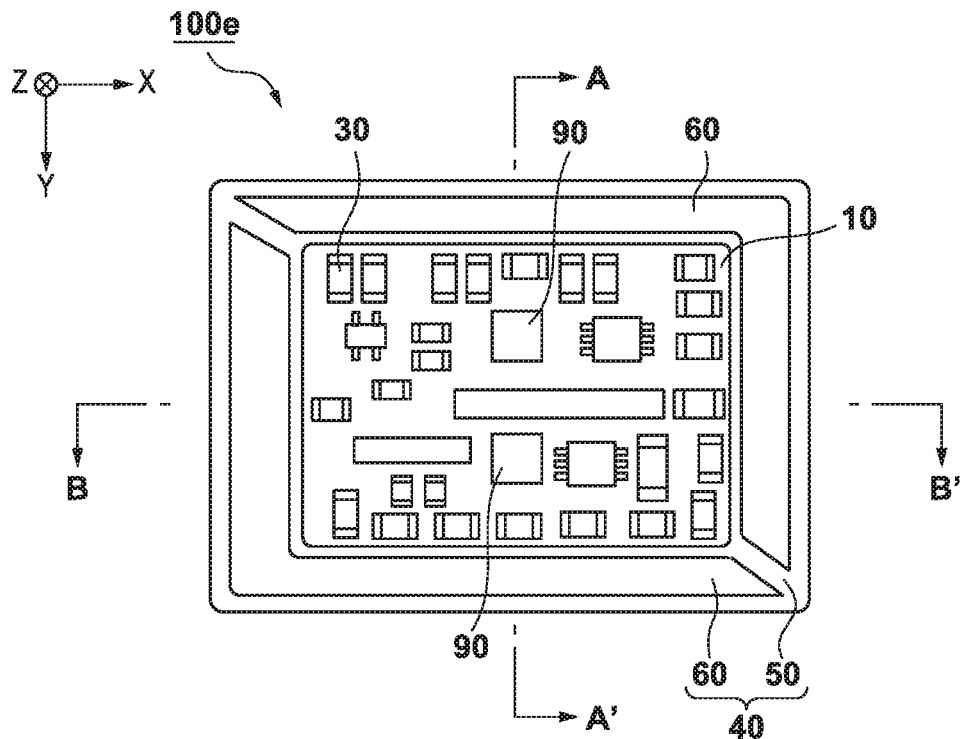
FIGS. 10A and 10B are diagrams illustrating an example of a configuration of an electronic module according to some embodiments.
Figure 10B:
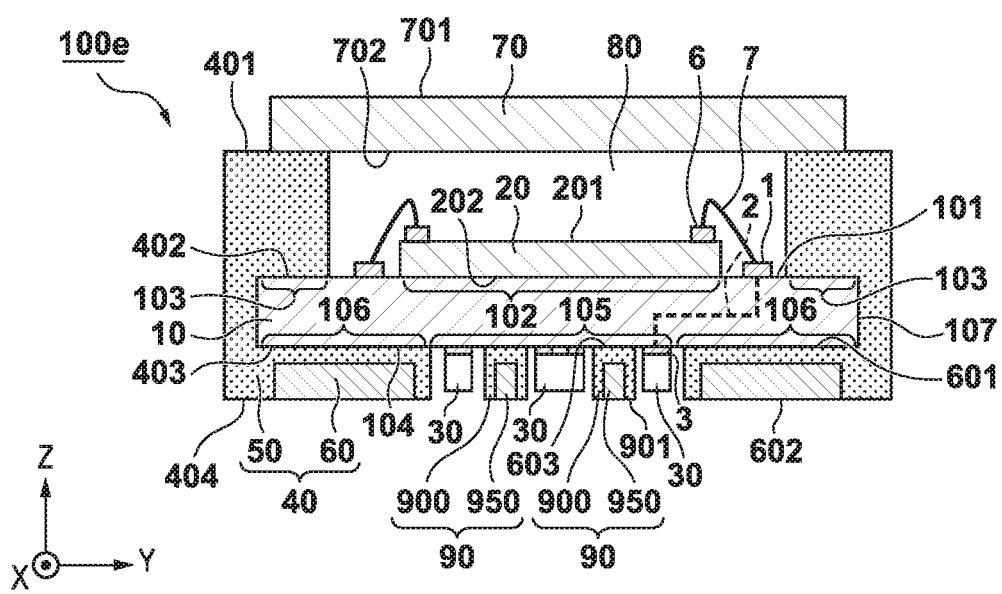

With reference to FIGS. 10A and 10B, an example of a configuration of an electronic module 100e will be described as a third embodiment of the present invention. FIG. 10A is a schematic plan view of the electronic module 100e as viewed from the back side. FIG. 10B is a cross-sectional schematic view of the electronic module 100e taken along line A-A' in FIG. 10A. A schematic plan view of the electronic module 100e as viewed from the front side and a cross-sectional schematic view of the electronic module 100e taken along line B-B' in FIG. 10A may be similar to corresponding views of the electronic module 100a and are thus omitted.

The electronic module 100e is similar to the electronic module 100a except that the electronic module 100e further includes heat radiation members 90. In other words, the electronic module 100e has a configuration in which the heat radiation members 90 are added to the electronic module 100a. Alternatively, the heat radiation members 90 may be added to the embodiments or variation examples described above other than the electronic module 100a.

The heat radiation members 90 are attached to the central region 105 of the rear surface 104 of the substrate 10. The heat radiation members 90 function to release heat generated by the electronic device 20 from the rear surface side of the electronic module 100e. The heat radiation members 90 may also be referred to as supports when the heat radiation members 90 function to support the substrate 10 from the rear surface side. The electronic module 100e further includes the heat radiation members 90 to enable an increase in the number of thermal conduction paths immediately below the electronic device 20. Additionally, the heat radiation members 90, together with the frame member 40 formed on the rear surface 104, improve the effect of suppressing damage or the like caused by contact with the component 30. One or a plurality of the heat radiation members 90 may be provided. An increase in the number of heat radiation members 90 improves the thermal conduction effect. On the other hand, a reduction in the number of heat radiation members 90 increases the area of the region where the components 30 can be mounted. The components 30 are positioned between the frame member 40 and each of the heat radiation members 90 in any direction. Accordingly, heat from the electronic device 20 may be discharged to the outside of electronic module 100e on both sides of components 30.

Each of the heat radiation members 90 includes a low-conductivity member 900 and a high-conductivity member 950. The high-conductivity member 950 has a higher thermal conductivity than the low-conductivity member 900. The thermal conductivity of the high-conductivity member 950 may be, for example, 1.0 W/m·K or higher, or even 10 W/m·K or higher. The high-conductivity member 950 may be a metal in view of thermal conductivity, processing accuracy, and the like. In a case where the high-conductivity member 950 is a metal, the high-conductivity member 950 is electrically separated from the electronic device 20 by the substrate 10, which is insulative. The thermal conductivity of the low-conductivity member 900 may be, for example, 1.0 W/m·K or lower. The low-conductivity member 900 may be a resin in view of thermal conductivity, processing accuracy, easiness of formation, and the like. In a case where the low-conductivity member 900 is a resin, the low-conductivity member 900 may be formed in tight contact with the substrate 10 and the high-conductivity member 950 by a resin molding method such as a transfer molding method. Alternatively, the low-conductivity member 900 may be fixed to the substrate 10 and the high-conductivity member 950 using an adhesive. Fixation based on the resin molding method is easier than the method of fixation with an adhesive.

Instead of including the low-conductivity member 900 and the high-conductivity member 950, each of the heat radiation members 90 may include only the low-conductivity member 900 or only the high-conductivity member 950. The low-conductivity member 900 may be formed of the same material as that of the low-conductivity member 50 or a material different from the material of the low-conductivity member 50. The high-conductivity member 950 may be formed of the same material as that of the high-conductivity member 60 or a material different from the material of the high-conductivity member 60.

A lower surface 901 of each heat radiation member 90 (that is, one of the surfaces of the heat radiation member 90 located on a side opposite to the substrate 10) may have the same height from the rear surface 104 of the substrate 10 as that of the lower surface 404 of the frame member 40. As a result, the lower surface 901 of the heat radiation member 90 and the lower surface 404 of the frame member 40 are flush with each other.

The high-conductivity member 950 has a portion overlapping with the electronic device 20 in a plan view of the mounting surface 101. In the example in FIGS. 10A and 10B, the entire high-conductivity member 950 overlaps the electronic device 20. Alternatively, a part of the high-conductivity member 950 may exclusively overlap the electronic device 20.

A part of the low-conductivity member 900 is located between the high-conductivity member 950 and the components 30. In other words, one of the surfaces of the high-conductivity member 950 located on a side of the components 30 is covered by the low-conductivity member 900. In a case where the plurality of components 30 are present around the heat radiation member 90, a plurality of surfaces may be located on a side of the components 30. In the present embodiment, one of the surfaces of the high-conductivity member 950 located on a side of the substrate 10 is also covered by the low-conductivity member 900. One of the surfaces of the high-conductivity member 950 located on a side opposite to the substrate 10 is exposed to the outside and forms a part of the external shape of the electronic module 100. The high-conductivity member 950 being thus exposed to the outside improves the thermal conduction effect compared to the high-conductivity member 950 being not exposed to the outside because in this case, the high-conductivity member 950 can directly contact a heat radiator or the like outside the electronic module 100e. Since a part of the low-conductivity member 900 is positioned between the high-conductivity member 950 and the components 30, heat emitted to the outside of the electronic module 100 through the high-conductivity member 950 can be inhibited from being transferred to the components 30.

In the electronic module 100e, the thickness of each heat radiation member 90 in the Z direction is greater than the height of each component 30. The height of the component 30 is a height with reference to the rear surface 104. As described above, the Z direction is a direction orthogonal to the rear surface 104. Since the thickness of the heat radiation member 90 is greater than the height of the component 30, in this structure, the components 30 are not easily contacted from outside the electronic module 100e. Accordingly, damage caused by, for example, contact of the components 30 can be suppressed, thus improving the yield of the electronic module 100e.

On the lower surface 901 of the heat radiation member 90 of the electronic module 100e, the low-conductivity member 900 and the high-conductivity member 950 are flush with each other. The heat radiation members 90 having such a structure can be easily formed. Additionally, complication of the structure of the heat radiator or the like outside the electronic module 100e is prevented, thus allowing thermal conduction to be facilitated. This also improves the yield of electronic module 100e.

Figure 11A:
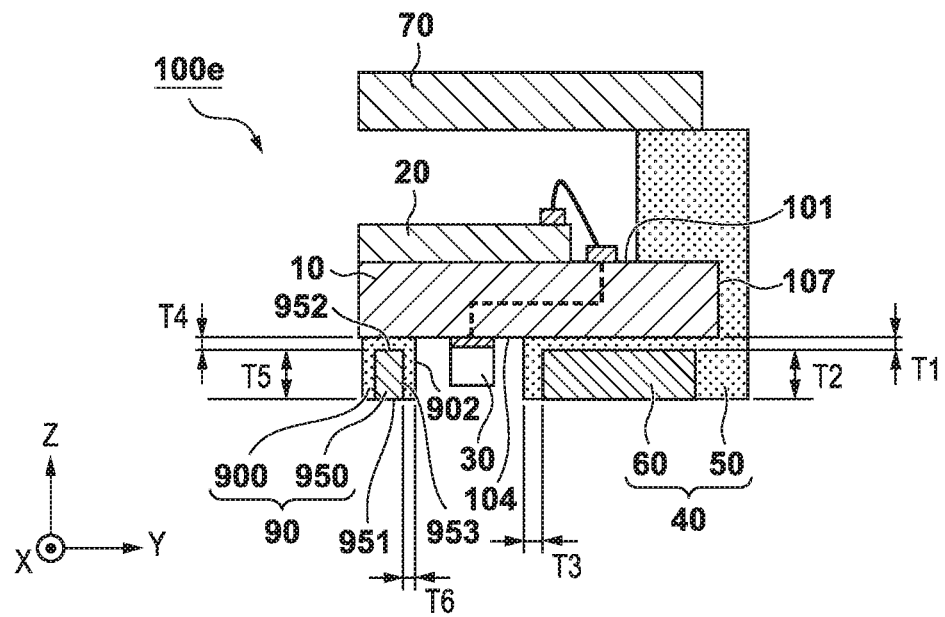
FIGS. 11A and 11B are diagrams illustrating an example of a configuration of an electronic module according to some embodiments.
Figure 11B:
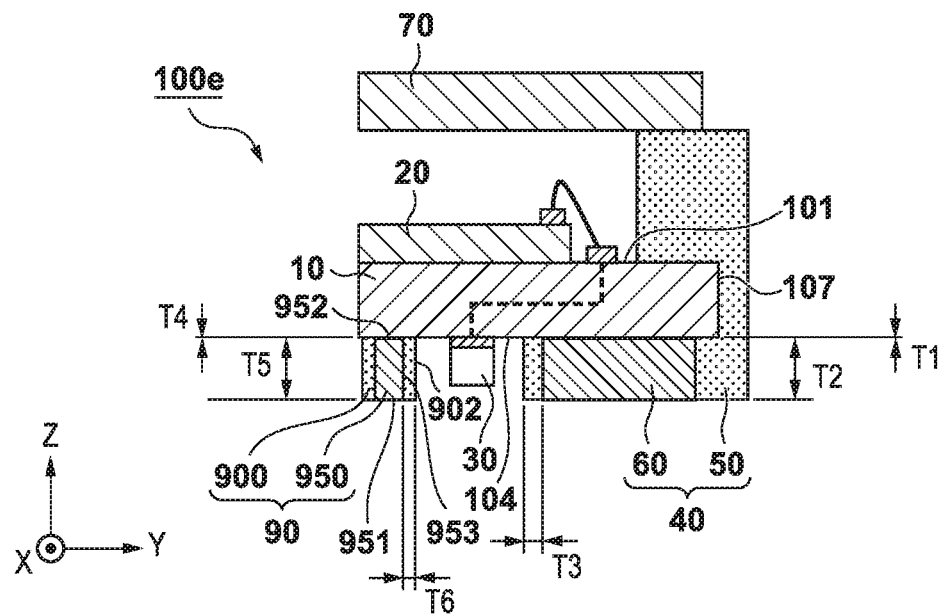

With reference to FIGS. 11A and 11B, a dimension relationship between the low-conductivity member 900 and the high-conductivity member 950 will be described in further detail. FIGS. 11A and 11B are enlarged views of a part of FIG. 10B. The shortest distance between the high-conductivity member 950 and the rear surface 104 in the Z direction is designated as T4. T4 equals the shortest distance between a surface 952 (the surface on a side of the substrate 10) of the high-conductivity member 950 and the rear surface 104. The thickness of the high-conductivity member 950 in the Z direction is designated as T5. T5 equals the shortest distance between the surface 952 of the high-conductivity member 950 and a surface 951 (the surface opposite to the substrate 10). T6 denotes the thickness of a portion of the low-conductivity member 900 located between the high-conductivity member 950 and the components 30 in the normal direction (Y direction) of a surface 953 (the surface on a side of the components 30) of the high-conductivity member 950. T6 equals the shortest distance between a surface 902 of the low-conductivity member 900 facing the components 30 and the surface 953 of the high-conductivity member 950.

The high-conductivity member 950 of the electronic module 100e is formed to satisfy T5>T4. A reduction in T4 allows the high-conductivity member 950 to be located closer to the substrate 10. This improves the thermal conduction effect compared to the case of T5<T4. T4=0 may be set. In this case, as illustrated in FIG. 11B, the high-conductivity member 950 (in particular, the surface 952 of the high-conductivity member 950) contacts the peripheral region 106 of the rear surface 104. Accordingly, the thermal conduction effect is further improved.

The high-conductivity member 950 of the electronic module 100e is formed to satisfy T6>T4. Heat transferred to the high-conductivity member 950 can be inhibited from reaching the components 30 due to the presence of a part of the low-conductivity member 900 between the high-conductivity member 950 and the components 30. Furthermore, with this portion of the low-conductivity member 900 formed to be wide, the effect of suppressing heat transfer to the components 30 is improved.

T4 may be 70 μm or less. By setting T4 to 70 μm or less, thermal conduction from the substrate 10 to the high-conductivity member 950 can be effectively improved. T5 may be 0.2 mm or more. By setting T5 to 0.2 mm or more, sufficient thermal conductivity can be ensured. T5 may be 2 mm or less. By setting T5 to 2 mm or less, an increase in the size of the electronic module 100e can be suppressed. The T6 may be 70 μm or more. By setting T6 to 70 μm or more, thermal conduction from the high-conductivity member 950 to the components 30 can be effectively suppressed. T6 may be 1 mm or less. By setting T6 to 1 mm or less, a region large enough to mount the components 30 can be secured.

Other Embodiments

The electronic module 100 and the like described above can be applied to various equipment. The applicable equipment may include, for example, electronic information equipment (electronic equipment, information equipment) such as smartphones, cameras, and personal computers. The equipment to which the present invention can be applied may include, for example, communication equipment for performing wireless communication or the like, office equipment such as copiers and scanners, and transport equipment such as automobiles, ships, and airplanes. The equipment to which the present invention can be applied may include, for example, industrial equipment such as robots, analytical instruments using energy beams (light, electrons, radio waves), and medical equipment such as endoscopes and radiation. In equipment to which the present invention is applied, a circuit board of the electronic module of the above-described embodiments is connected to another component included in the equipment. The function of another component to which the circuit board is connected can be set as appropriate by the function of the electronic module and is, for example, a component for controlling or driving the electronic module or a component for processing a signal in communication with the electronic module. Employing the electronic module of the present embodiment to the equipment is advantageous for improving equipment durability and reliability and reducing the size and weight of the equipment. The equipment equipped with an image capturing module includes, for example, various equipment such as digital still cameras, digital camcorders, monitoring cameras, copiers, faxes, mobile phones, on-board cameras, observation satellites, and medical cameras. This equipment includes optical systems, electronic devices, and processing apparatuses. An electronic device used as an image capturing device performs photoelectric conversion on a subject image formed by an optical system and outputs the resultant image as an image signal or a focus detection signal. The processing apparatus executes image processing, equipment control processing, and the like, based on the signal output from the image capturing device. An example of equipment control includes control of a moving body such as a vehicle, a ship, or an airplane.

Figure 12:
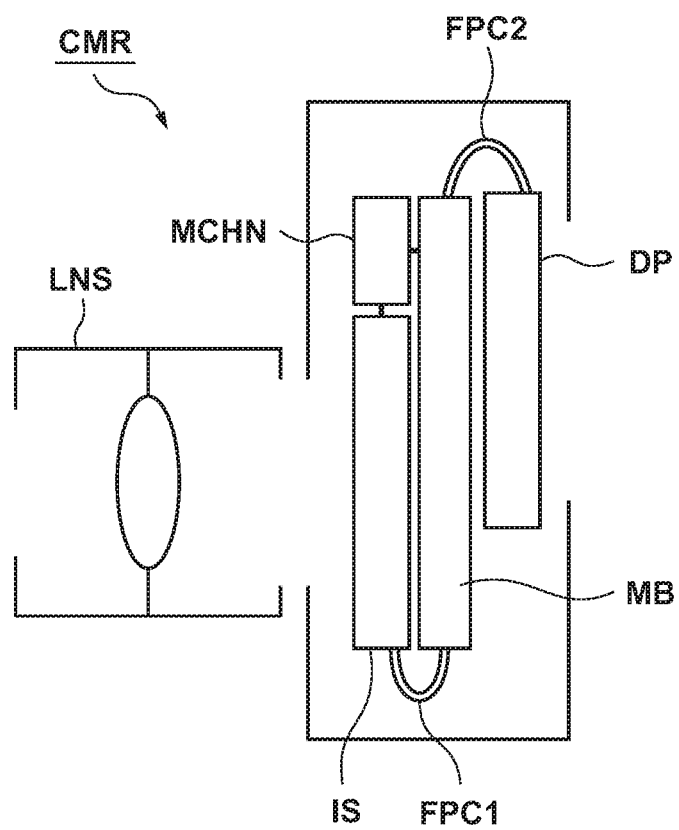
FIG. 12 is a diagram illustrating an example of a configuration of a camera according to some embodiments.

FIG. 12 illustrates a camera CMR as an example of equipment to which an electronic module is applied. The camera CMR may include an image capturing module IS, an electrical module MB, and a display module DP. The electrical module MB is a component for controlling or powering the image capturing module IS and/or the display module DP or is a component for processing signals communicated to and from the image capturing module IS and/or the display module DP. The electrical module MB may be connected to the circuit board of the electronic module via flexible lines. In the camera CMR, the display module DP may constitute an electronic viewfinder (EVF) or a touch panel. Additionally, the camera CMR may include a lens LNS that is detachable from a camera body or the lens LNS fixed to the camera body. The camera CMR may include a mechanical module MCHN for moving the image capturing module IS within the camera body. The electronic module according to any of the embodiments described above may be either the image capturing module IS or the display module DP. The image capturing module IS is connected to the electrical module MB via a flexible printed circuit board FPC1 connected to the image capturing module IS. The display module DP is connected to the electrical module MB via a flexible printed circuit board FPC2 connected to the display module DP. A wiring member connecting the electrical module MB and the image capturing module IS or the display module DP is not limited to a flexible printed circuit board but may be a cable. The wiring member such as a flexible printed circuit board may be connected to a connector included in a group of electronic components. In the camera CMR, a camera shake prevention (anti-vibration) function can be realized by the mechanical module MCHN by moving (displacing) the image capturing module IS, corresponding to the electronic module. The image capturing module IS to which the electronic module according to the present embodiment is applied has a reduced weight. This enables an increase in the movement speed of the image capturing module IS and a reduction in the load on the mechanical module MCHN for movement. The electronic module according to the present embodiment is reliable, and thus the durability of the equipment associated with the movement of such an electronic module can be increased.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-116631, filed Jun. 24, 2019, which is hereby incorporated by reference herein in its entirety.

What is claimed is:

1. An electronic module comprising:
   a substrate including a first surface and a second surface on a side opposite to the first surface, the second surface including a first region and a second region surrounding the first region;
   an electronic device attached to the first surface;
   a component attached to the first region of the second surface;
   a lid member positioned to face the electronic device; and
   a frame member attached to the substrate to support the lid member,
   wherein, on the second surface the frame member includes a first member and second member having a higher thermal conductivity than the first member,
   wherein at least a part of the second member is positioned to face the second region, and
   wherein at least a part of the first member is positioned between the second member and the component.

2. The electronic module according to claim 1, wherein, in a plan view of the first surface, the second member includes a portion overlapping the electronic device.

3. The electronic module according to claim 1, wherein a shortest distance between the at least a part of the second member and the second surface in a direction orthogonal to the second surface is less than a thickness of the at least a part of the second member in the direction.

4. The electronic module according to claim 1, wherein a shortest distance between the at least a part of the second member and the second surface in a direction orthogonal to the second surface is less than a thickness of the at least a part of the first member in a normal direction of a surface of the second member facing the component.

5. The electronic module of claim 1, wherein the at least a part of the second member is in contact with the second region of the second surface.

6. The electronic module of claim 1, wherein the at least a part of the second member forms a part of an external shape of the electronic module.

7. The electronic module according to claim 1, wherein, in a direction orthogonal to the second surface, a thickness of a portion of the frame member facing the second region is greater than a height of the component.

8. The electronic module according to claim 1, further comprising a heat radiation member attached to the second surface of the substrate,
   wherein the component is positioned between the frame member and the heat radiation member.

9. The electronic module according to claim 8, wherein, in a plan view of the first surface, the heat radiation member includes a portion overlapping the electronic device.

10. The electronic module according to claim 8, wherein the heat radiation member includes a third member and a fourth member having a higher thermal conductivity than the third member, and
    wherein a part of the third member is positioned between the fourth member and the component.

11. The electronic module according to claim 10, wherein a shortest distance between the fourth member and the second surface in a direction orthogonal to the second surface is less than a thickness of the fourth member in the direction.

12. The electronic module according to claim 10, wherein a shortest distance between the fourth member and the second surface in a direction orthogonal to the second surface is less than a thickness of the part of the third member in a normal direction of a surface of the fourth member facing the component.

13. The electronic module according to claim 10, wherein the fourth member is in contact with the second surface.

14. The electronic module according to claim 10, wherein the fourth member forms a part of an external shape of the electronic module.

15. The electronic module according to claim 10, wherein the second member includes a material identical to a material for the fourth member of the heat radiation member.

16. The electronic module according to claim 8, wherein a thickness of the heat radiation member in a direction orthogonal to the second surface is greater than a height of the component.

17. The electronic module according to claim 1, wherein the second surface is rectangular, and the second member includes a portion extending along one side of the second surface.

18. The electronic module according to claim 17, wherein a length of an extending portion of the second member is greater than half of a length of the one side.

19. An equipment comprising:
    an electronic module as described in claim 1;
    a wiring member connected to a connector attached to the first region of the second surface; and
    an electrical module connected to the electronic module via the wiring member.

20. The electronic module according to claim 1, wherein, in plan view from the second surface, a part of the first member, the second member, and a part of the second surface are overlapping.

21. The electronic module according to claim 1, wherein the first member is formed by a resin material and the second member is formed by a metal material.

22. The electronic module according to claim 1, wherein a part of the first member positioned between the second member and the component is positioned between the second member and a part of the second surface.

23. An electronic module comprising:
- a substrate including a first surface and a second surface on a side opposite to the first surface, the second surface including a first region and a second region surrounding the first region;
- an electronic device attached to the first surface;
- a component attached to the first region of the second surface;
- a lid member positioned to face the electronic device; and
- a frame member attached to the substrate to support the lid member,
- wherein the frame member includes a first member and a second member having a higher thermal conductivity than the first member are disposed at least on the second surface,
- wherein at least a part of the second member is positioned to face the second region, and
- wherein at least a part of the first member is positioned between the second member and the component.

* * * * *